United States Patent
Do et al.

(10) Patent No.: US 7,701,049 B2
(45) Date of Patent: Apr. 20, 2010

(54) INTEGRATED CIRCUIT PACKAGING SYSTEM FOR FINE PITCH SUBSTRATES

(75) Inventors: Byung Tai Do, Singapore (SG); Il Kwon Shim, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 312 days.

(21) Appl. No.: 11/833,882

(22) Filed: Aug. 3, 2007

(65) Prior Publication Data

US 2009/0032932 A1 Feb. 5, 2009

(51) Int. Cl.
*H01L 23/52* (2006.01)
(52) U.S. Cl. .................. 257/691; 257/690; 257/713; 361/777; 361/778
(58) Field of Classification Search ............. 257/690, 257/691, 713, 776, 780; 361/777, 778, 794
See application file for complete search history.

(56) References Cited

U.S. PATENT DOCUMENTS

| | | | |
|---|---|---|---|
| 4,742,023 A | 5/1988 | Hasegawa | |
| 5,328,079 A | 7/1994 | Mathew et al. | |
| 5,329,157 A | 7/1994 | Rosotker | |
| 5,340,770 A | 8/1994 | Allman et al. | |
| 5,444,303 A | 8/1995 | Greenwood et al. | |
| 5,465,899 A | 11/1995 | Quick et al. | |
| 5,561,086 A | 10/1996 | Rostoker | |
| 5,654,585 A | 8/1997 | Nishikawa | |
| 5,686,762 A | 11/1997 | Langley | |
| 5,734,559 A | 3/1998 | Banerjee et al. | |
| 5,818,144 A | 10/1998 | Kim | |
| 5,904,288 A | 5/1999 | Humphrey | |
| 5,960,262 A | 9/1999 | Torres et al. | |
| 5,994,169 A | 11/1999 | Lamson et al. | |
| 6,008,532 A | 12/1999 | Carichner | |
| 6,137,168 A * | 10/2000 | Kirkman | 257/691 |
| 6,158,647 A | 12/2000 | Chapman et al. | |
| 6,194,786 B1 * | 2/2001 | Orcutt | 257/780 |
| 6,294,830 B1 | 9/2001 | Fjelstad | |
| 6,329,278 B1 | 12/2001 | Low et al. | |
| 6,359,341 B1 * | 3/2002 | Huang et al. | 257/778 |
| 6,420,256 B1 | 7/2002 | Ball | |
| 6,462,414 B1 | 10/2002 | Anderson | |
| 6,541,848 B2 | 4/2003 | Kawahara et al. | |
| 6,561,411 B2 | 5/2003 | Lee | |
| 6,624,059 B2 | 9/2003 | Ball | |
| 6,713,881 B2 | 3/2004 | Umehara et al. | |
| 6,740,352 B2 | 5/2004 | Lee et al. | |
| 6,787,926 B2 | 9/2004 | Chen et al. | |
| 6,815,836 B2 | 11/2004 | Ano | |
| 6,849,931 B2 | 2/2005 | Nakae | |
| 7,375,978 B2 * | 5/2008 | Conner et al. | 361/794 |
| 7,453,156 B2 | 11/2008 | Lee et al. | |
| 2003/0015784 A1 * | 1/2003 | Liaw et al. | 257/691 |
| 2004/0152292 A1 | 8/2004 | Babinetz et al. | |
| 2005/0133928 A1 | 6/2005 | Howard et al. | |
| 2006/0049523 A1 | 3/2006 | Lin | |
| 2006/0102694 A1 | 5/2006 | Lee et al. | |
| 2006/0113665 A1 | 6/2006 | Lee et al. | |

\* cited by examiner

*Primary Examiner*—Phuc T Dang
(74) *Attorney, Agent, or Firm*—Mikio Ishimaru

(57) ABSTRACT

An integrated circuit packaging system comprising: forming a substrate including; patterning a bonding pad on the substrate, patterning a first signal trace coupled to the bonding pad, patterning a second signal trace on the substrate, and connecting a pedestal on the second signal trace; mounting an integrated circuit on the substrate; and coupling an electrical interconnect between the integrated circuit, the bonding pad, the pedestal, or a combination thereof.

18 Claims, 4 Drawing Sheets

INTEGRATED CIRCUIT PACKAGING SYSTEM FOR FINE PITCH SUBSTRATES

CROSS-REFERENCE TO RELATED APPLICATION(S)

The present application contains subject matter related to U.S. patent application Ser. No. 11/273,635, now U.S. Pat. No. 7,453,156. The related application is assigned to Chip PAC, Inc. The subject matter thereof in its entirety is hereby incorporated hereinto by reference thereto.

TECHNICAL FIELD

The present invention relates generally to integrated circuit packaging, and more particularly to a system for wire bonding a substrate having very fine pitch traces.

BACKGROUND ART

Today's consumer electronics, such as personal digital assistants (PDA), smart phones, and global positioning systems (GPS) are packing more functions into an ever-shrinking physical space with expectations for decreasing cost and enhanced reliability. Every new generation of integrated circuit, with increased operating frequency, performance and the higher level of integration has increased the need for integrated circuit packaging to provide more solutions managing an increasing number of interconnects that the integrated circuit requires.

Many approaches have been developed to meet these requirements. Some of the research and development strategies focus on new package technologies while others focus on improving the existing and mature package technologies. Both approaches may include additional processing of the integrated circuits to better match the targeted package.

The continued emphasis in the integrated circuit technology is to create improved performance integrated circuit devices at competitive prices. This emphasis over the years has resulted in increasing miniaturization of integrated circuit devices, made possible by continued advances of integrated circuit processes and materials in combination with new and sophisticated package designs.

The high performance integrated circuits used in compute platforms and communication devices support a very high density of interface contact points or pads. As the size of the devices shrinks, the interconnect technology must be able to manage the shrinking space between the pads. Some technologies have been developed that allow an increased number of interconnect pads to reside in the allocated space while other technologies new direct connect techniques. The new techniques have not achieved the level of reliability and price competitiveness that is required for very high volume production.

Still thinner, smaller, and lighter package designs and integrated circuit designs and printed circuit designs have been adopted in response to continuing requirements for further miniaturization. At the same time, users are demanding the entire system, including integrated circuit, packages and printed circuit board that are more reliable under increasingly severe operating conditions.

Thus, a need still remains for an integrated circuit packaging system for fine pitch substrates that provides low cost manufacturing, improved yield, improved reliability, and greater flexibility. In view of the ever-increasing need to save costs and improve efficiencies, it is more and more critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system comprising: forming a substrate including; patterning a bonding pad on the substrate, patterning a first signal trace coupled to the bonding pad, patterning a second signal trace on the substrate, and connecting a pedestal on the second signal trace; mounting an integrated circuit on the substrate; and coupling an electrical interconnect between the integrated circuit, the bonding pad, the pedestal, or a combination thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
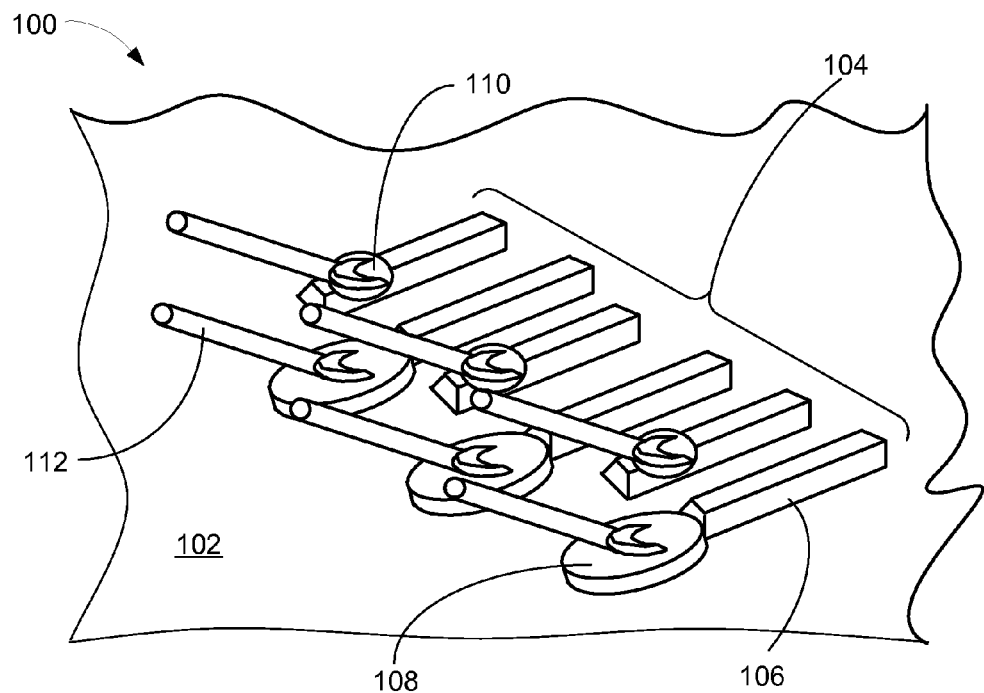
FIG. 1 is an isometric view of an integrated circuit packaging system for fine pitch substrates, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown an isometric view of an integrated circuit packaging system 100 for fine pitch substrates, in an embodiment of the present invention. The isometric view of the integrated circuit packaging system 100 depicts a substrate 102, such as a ceramic, a laminate, or printed circuit board substrate, having an array 104 of the signal traces 106 in a fine pitch configuration. A fine pitch configuration is considered to be an array 104 having a trace to trace spacing of less than 1 millimeter. An alternating pattern of a bonding pad 108 and a pedestal 110, such as a ball bond that has been flattened by coining, is arranged on the array 104 of the signal traces 106. The signal trace 106 having a bonding pad 108 is referred to herein as a first signal trace, and the signal trace 106 having a pedestal 110 is referred to herein as a second signal trace. An electrical interconnect 112, such as a bond wire, may be used to establish an electrical connection to an integrated circuit (not shown).

The substrate patterning process may start with a thin metal foil positioned as the bonding pads 108. The signal traces 106 require a thicker layer of metal in order to meet the electrical requirements of the substrate 102. The added metal may be plated on the signal traces 106 in a secondary operation. The minimum dimensions of the signal trace 106 are set by the design rules of the associated technology. The signal traces 106 may be of different dimensions based on the electrical requirements of the individual applications. In order to meet the transmission line requirements of high-end applications, the bonding pads 108 and the signal traces 106 may be plated to a uniform thickness and the adjustments to the thickness of the individual segments may be performed by a subtractive process, such as etching or chemical mechanical planarization, an additive process, or a combination thereof.

The signal trace 106 having the pedestal 110 attached is positioned between a pair of the bonding pads 108. The size of the bonding pad 108 allows a reliable electrical connection to be made by the electrical interconnect 112. This configuration allows for an efficient high volume process that is reliable and cost effective. By providing sufficient space for the bond connection a normal wire bond yield, such as the yield provided by a wide pitch process, may be supported. The application of a wide pitch process may be defined as having traces spaced greater than 1 millimeter apart.

The figure shows only six of the signal traces 106, but it is understood that this is an example only and the actual substrate 102 may have any number of the signal traces 106. The difference in thickness of the bonding pads 108 and the signal trace 106 with the pedestal 110 mounted thereon provides sufficient vertical clearance for the electrical interconnect 112.

Figure 2:
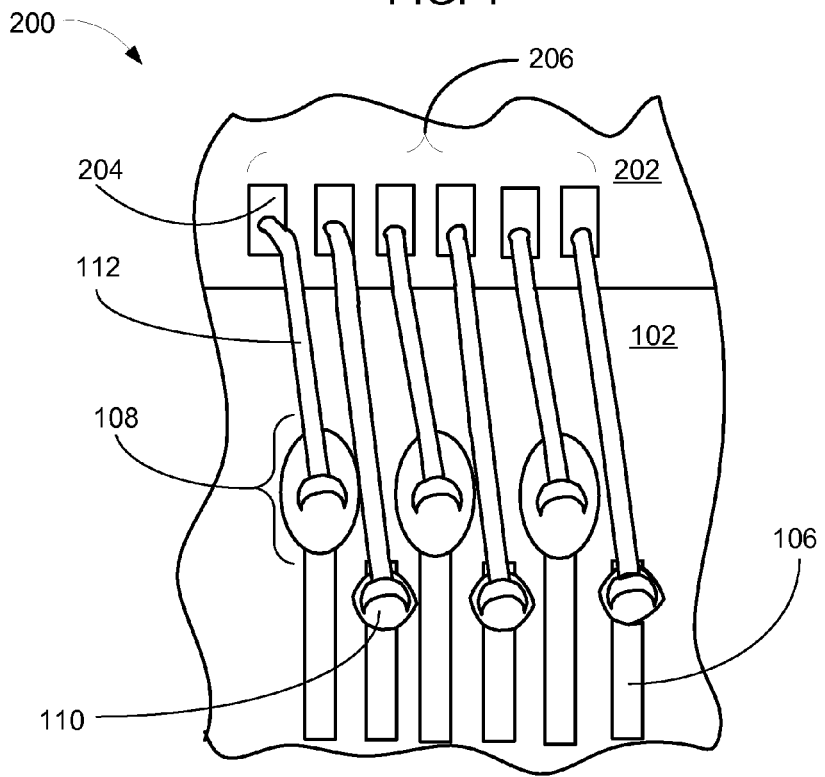
FIG. 2 is a top view of an integrated circuit packaging system for fine pitch substrates, in an embodiment of the present invention.

Referring now to FIG. 2, therein is shown a top view of an integrated circuit packaging system 200 for fine pitch substrates, in an embodiment of the present invention. The top view of the integrated circuit packaging system 200 depicts an integrated circuit 202 having a contact pad 204 arranged in a fine pitch array 206. A bonding pad 108 is coupled to the contact pad 204 by an electrical interconnect 112, such as a bond wire. A pedestal 110, such as a ball bond that has been flattened by coining, for coupling the electrical interconnect 112. The pedestal 110 is electrically connected to a signal trace 106 patterned on the substrate 102, such as a ceramic, printed circuit board, or other laminate material. The signal trace 106 is also electrically connected to the bonding pad 108 for coupling a signal between the signal trace 106 and the integrated circuit 202.

The shape of the bonding pad 108 is centered with the signal trace 106. This allows two of the bonding pads 108 to be placed adjacent to the signal trace 106 having the pedestal 110 attached. The size of the bonding pad 108 allows a reliable electrical connection to be made by the electrical interconnect 112. This configuration allows for an efficient high volume process that is reliable and cost effective. By providing sufficient space for the bond connection a normal wire bond yield may be supported.

The figure shows only six of the signal traces 106, but it is understood that this is an example only and the actual substrate 102 may have a different number of the signal traces 106. The difference in thickness of the bonding pads 108 and the signal trace 106 with the pedestal 110 mounted thereon provides sufficient vertical clearance for the electrical interconnects 112.

Figure 3:
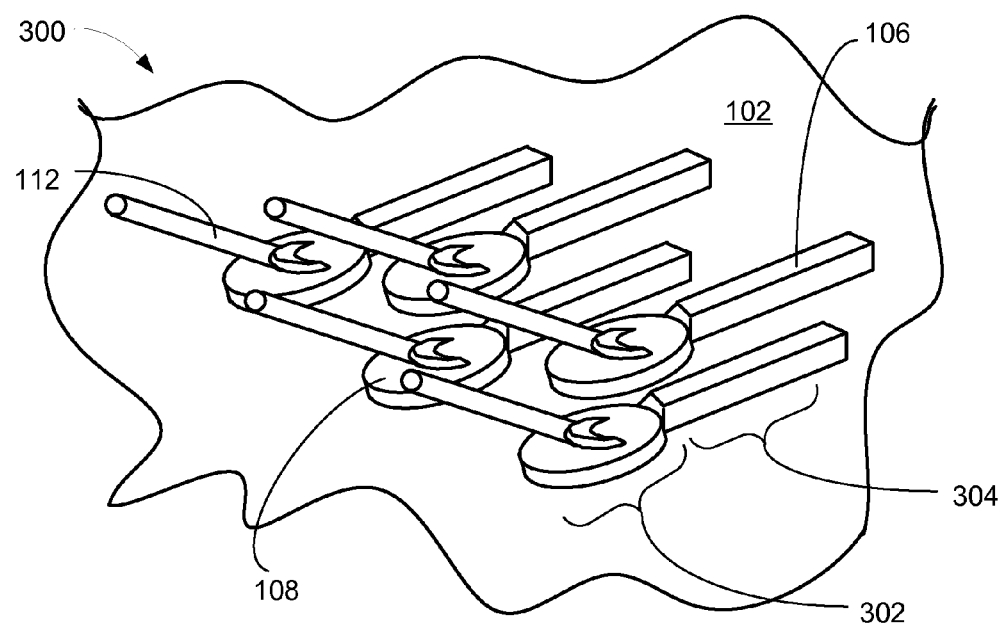
FIG. 3 is an isometric view of an integrated circuit packaging system for fine pitch substrates, in an alternate embodiment of the present invention.

Referring now to FIG. 3 therein is shown an isometric view of an integrated circuit packaging system 300 for fine pitch substrates, in an alternate embodiment of the present invention. The isometric view of the integrated circuit packaging system 300 depicts a first row 302 of the bonding pads 108 and a staggered second row 304. The staggered second row 304 of the bonding pads 108 are positioned in the gaps between the bonding pads 108 in the first row 302. The staggered second row 304 provides a way to meet the interconnect requirements of the integrated circuit 202, of FIG. 2.

The substrate patterning process may start with a thin metal foil positioned as the bonding pads 108. The signal traces 106 require a thicker layer of metal in order to meet the electrical requirements of the substrate. The added metal may be plated on the signal traces 106 in a secondary operation. The minimum dimensions of the signal trace 106 are set by the design rules of the associated technology. The signal traces 106 may be of different dimensions based on the electrical requirements of the individual applications. In order to meet the transmission line requirements of high-end applications, the bonding pads 108 and the signal traces 106 may be plated to a uniform thickness and the adjustments to the thickness of the individual segments may be performed by a subtractive process, such as etching or chemical mechanical planarization, an additive process, or a combination thereof.

Figure 4:
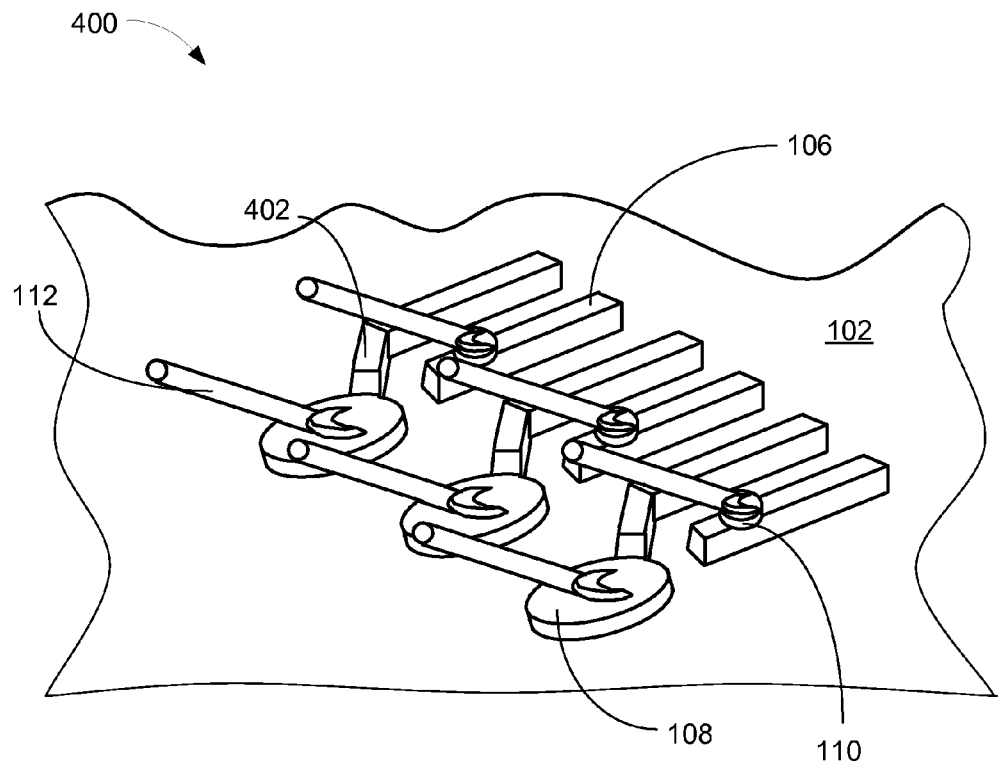
FIG. 4 is an isometric view of an integrated circuit packaging system for fine pitch substrates, in another alternate embodiment of the present invention.

Referring now to FIG. 4, therein is shown an isometric view of an integrated circuit packaging system 400 for fine pitch substrates, in another alternate embodiment of the present invention. The isometric view of the integrated circuit packaging system 400 depicts an array of the signal traces 106 in a fine pitch configuration. An alternating pattern of the bonding pads 108 and the pedestal 110 is arranged on the array of the signal traces 106. The center-line of the bonding pads 108 is aligned with the center-line of the pedestal 110. An extension 402 to the signal trace 106 is used to maintain connection with the bonding pads 108.

This configuration is suitable for a stack of the integrated circuit 202 configuration or the integrated circuit 202 that has a locally dense array of the contact pad 204. The figure shows only six of the signal traces 106, but it is understood that this is an example only and the actual substrate 102 may have a different number of the signal traces 106. The difference in thickness of the bonding pad 108 and the signal trace 106 with the pedestal 110 mounted thereon provides sufficient vertical clearance for the electrical interconnects 112.

Figure 5:
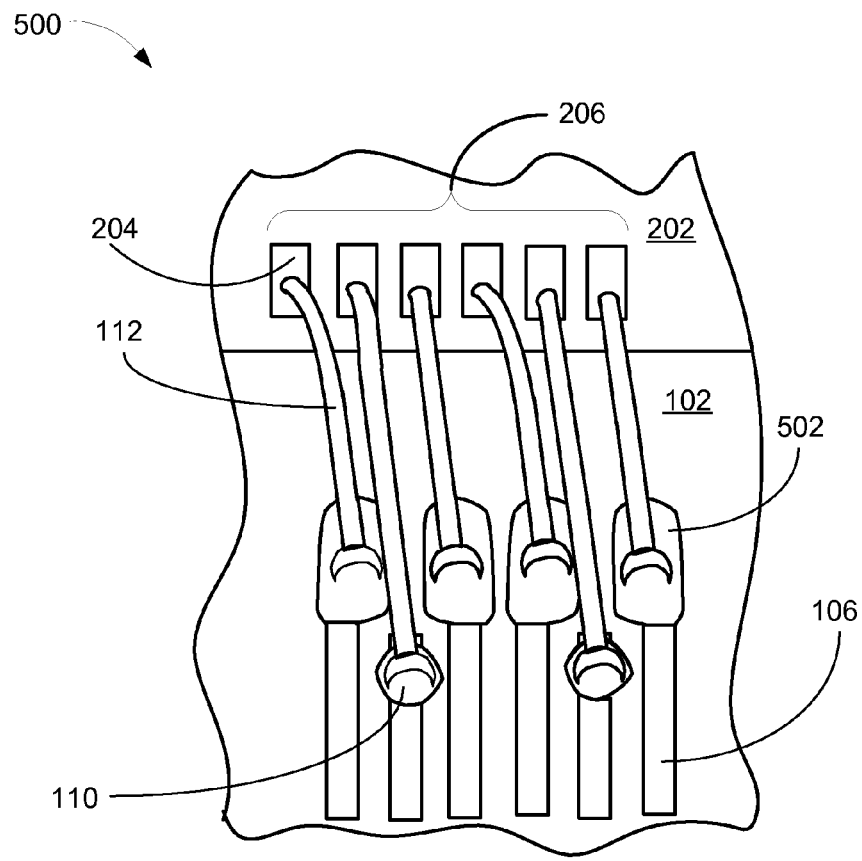
FIG. 5 is a top view of an integrated circuit packaging system for fine pitch substrates, in an embodiment of the present invention.

Referring now to FIG. 5, therein is shown a top view of an integrated circuit packaging system 500 for fine pitch substrates, in an embodiment of the present invention. The top view of the integrated circuit packaging system 500 depicts the integrated circuit 202 having the contact pad 204 arranged in the fine pitch array 206. An offset bonding pad 502 is coupled to the contact pad 204 by the electrical interconnect 112, such as a bond wire. The pedestal 110, such as a ball bond that has been flattened by coining, for coupling the electrical interconnect 112. The pedestal 110 is electrically connected to a signal trace 106 patterned on the substrate 102, such as a ceramic, printed circuit board, or other laminate material. The signal trace 106 is also electrically connected to the offset bonding pad 502 for coupling a signal between the signal trace 106 and the integrated circuit 202.

The shape of the offset bonding pad 502 is slightly offset from the centerline of the signal trace 106. This allows two of the offset bonding pads 502 to be placed adjacent to each other in a minimum of space. The signal trace 106 having the pedestal 110 attached is positioned between a pair of the offset bonding pads 502. The size of the offset bonding pad 502 allows a reliable electrical connection to be made by the electrical interconnect 112. This configuration allows for an efficient high volume process that is reliable and cost effective. By providing sufficient space for the bond connection a normal wire bond yield may be supported.

The figure shows only six of the signal traces 106, but it is understood that this is an example only and the actual substrate 102 may have a different number of the signal traces 106. The difference in thickness of the bonding pads 108 and the signal trace 106 with the pedestal 110 mounted thereon provides sufficient vertical clearance for the electrical interconnects 112.

Figure 6:
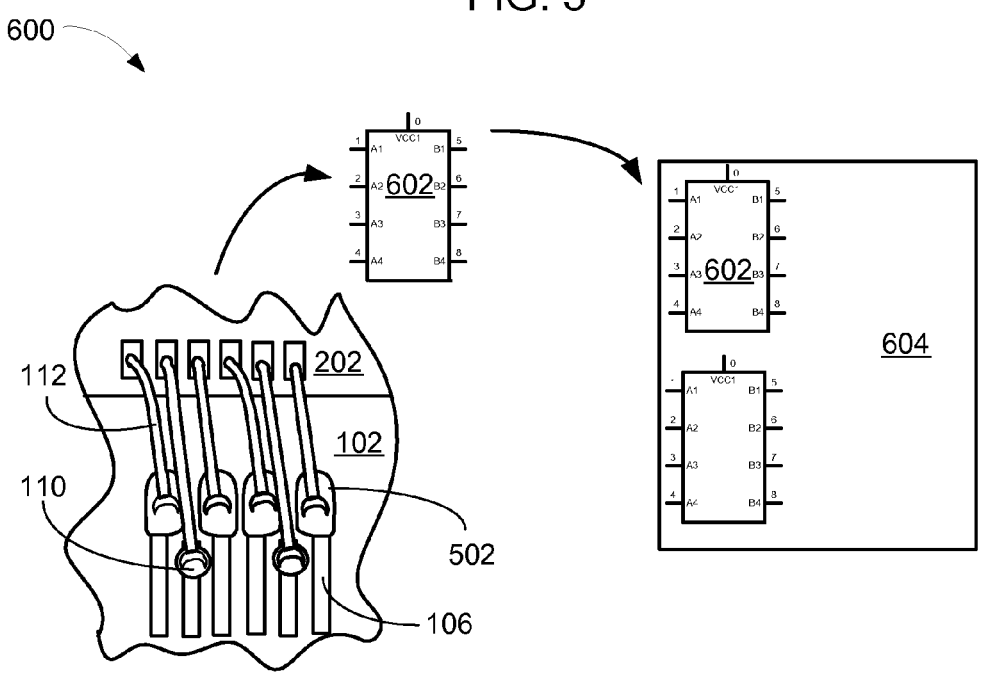
FIG. 6 is an application of the integrated circuit packaging system, of the present invention.

Referring now to FIG. 6, therein is shown an application of the integrated circuit packaging system 600, of the present invention. The application of the integrated circuit packaging system 600 depicts an integrated circuit package 602 formed by encapsulating the substrate 102, the integrated circuit 202, and the electrical interconnect 112. The integrated circuit package 602 may be assembled on a printed circuit board 604 for use in a system (not shown).

Figure 7:
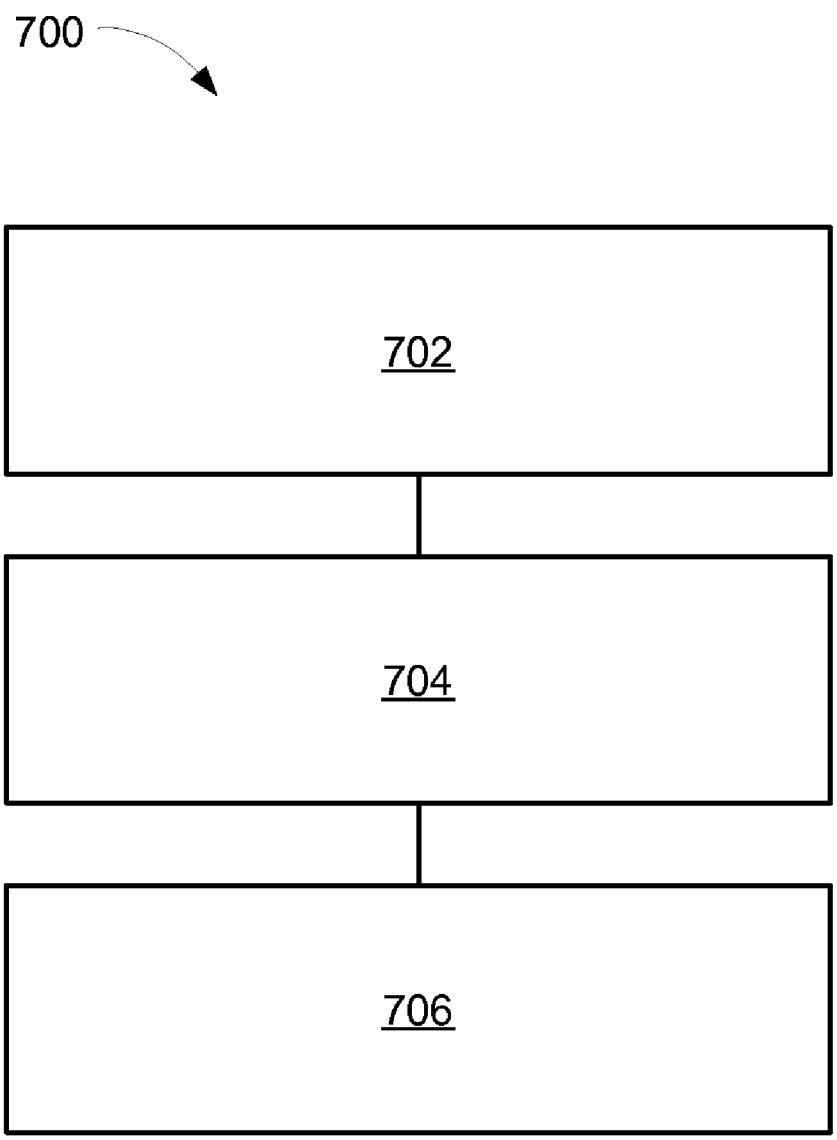
FIG. 7 is a flow chart of an integrated circuit packaging system for manufacturing the integrated circuit packaging system, in an embodiment of the present invention.

Referring now to FIG. 7, therein is shown a flow chart of an integrated circuit packaging system 700 for manufacturing an integrated circuit packaging system 100 in an embodiment of the present invention. The system 700 includes forming a substrate including; patterning a bonding pad on the substrate, patterning a first signal trace coupled to the bonding pad, patterning a second signal trace on the substrate, and connecting a pedestal on the second signal trace in a block 702; mounting an integrated circuit on the substrate in a block 704; and coupling an electrical interconnect between the integrated circuit, the bonding pad, the pedestal, or a combination thereof in a block 706.

In greater detail, a system to manufacturing an integrated circuit packaging system, according to an embodiment of the present invention, is performed as follows:

1. Forming a substrate including; patterning a bonding pad on the substrate by applying a thin foil, patterning a first signal trace coupled to the bonding pad by plating the signal trace, patterning a second signal trace on the substrate adjacent to the first signal trace, and connecting a pedestal on the second signal trace having a staggered position from the bond pad. (FIG. 2)
2. Mounting an integrated circuit on the substrate includes mounting an integrated circuit having a fine pitch array of the contact pad. (FIG. 2) and
3. Coupling an electrical interconnect between the integrated circuit, the bonding pad, the pedestal, or a combination thereof. (FIG. 2)

It has been discovered that the present invention thus has numerous aspects.

An aspect of the present invention is that it allows a standard manufacturing yield of a fine pitch packaging system which reduces cost and enhances reliability.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system for fine pitch substrates, of the present invention furnishes important and heretofore unknown and unavailable solutions, capabilities, and functional aspects for volume production of fine pitch substrates and packages with standard packaging yield of a wide pitch package. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices having fine pitch substrates, fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    forming a substrate including:
        patterning a bonding pad on the substrate,
        patterning a first signal trace coupled to the bonding pad,
        patterning a second signal trace on the substrate, and
        connecting a pedestal on the second signal trace including:
            forming a ball bond on the second signal trace; and
            coining the ball bond for creating a flat surface;

mounting an integrated circuit on the substrate; and
coupling an electrical interconnect between the integrated circuit, the bonding pad, the pedestal, or a combination thereof.

2. The system as claimed in claim 1 further comprising forming a staggered second row of the bonding pads for connecting the integrated circuit.

3. The system as claimed in claim 1 wherein forming the substrate includes:
   forming the first signal trace on the substrate;
   forming the second signal trace adjacent to the first signal trace;
   mounting the pedestal on the second signal trace; and
   positioning the bonding pad, coupled to the first signal trace, in line with the pedestal.

4. The system as claimed in claim 1 further comprising forming an integrated circuit package by encapsulating the substrate, the integrated circuit, and the electrical interconnect.

5. An integrated circuit packaging system comprising:
   forming a substrate including:
      patterning a bonding pad on the substrate by applying a foil,
      patterning a first signal trace coupled to the bonding pad by plating the first signal trace,
      patterning a second signal trace on the substrate adjacent to the first signal trace, and
      connecting a pedestal on the second signal trace having a staggered position from the bonding pad;
   mounting an integrated circuit on the substrate includes mounting an integrated circuit having a fine pitch array of the contact pads; and
   coupling an electrical interconnect between the integrated circuit, the bonding pad, the pedestal, or a combination thereof.

6. The system as claimed in claim 5 wherein connecting a pedestal includes:
   forming a ball bond on the second signal trace includes positioning the ball bond in a staggered array; and
   coining the ball bond for creating a flat surface.

7. The system as claimed in claim 5 further comprising forming a staggered second row of the bonding pad for connecting the integrated circuit including positioning the staggered second row in the gaps of a first row.

8. The system as claimed in claim 5 wherein forming the substrate includes:
   forming the first signal trace on the substrate;
   forming the second signal trace adjacent to the first signal trace;
   mounting the pedestal on the second signal trace; and
   positioning the bonding pad, coupled to the first signal trace, in line with the pedestal including coupling an electrical interconnect having a vertical clearance form the bonding pad.

9. The system as claimed in claim 5 further comprising forming an integrated circuit package by encapsulating the substrate, the integrated circuit, and the electrical interconnect including assembling a printed circuit board with the integrated circuit package.

10. An integrated circuit packaging system comprising:
    a substrate including:
       a bonding pad on the substrate,
       a first signal trace coupled to the bonding pad,
       a second signal trace on the substrate, and
       a pedestal on the second signal trace including:
          a ball bond on the second signal trace; and
          the ball bond coined for creating a flat surface;
    an integrated circuit mounted on the substrate; and
    an electrical interconnect coupled between the integrated circuit, the bonding pad, the pedestal, or a combination thereof.

11. The system as claimed in claim 10 further comprising a staggered second row of the bonding pad for connecting the integrated circuit.

12. The system as claimed in claim 10 wherein the substrate includes:
    the first signal trace on the substrate;
    the second signal trace adjacent to the first signal trace;
    the pedestal mounted on the second signal trace; and
    the bonding pad, coupled to the first signal trace, in line with the pedestal.

13. The system as claimed in claim 10 further comprising an integrated circuit package formed by the substrate, the integrated circuit, and the electrical interconnect encapsulated.

14. The system as claimed in claim 10 wherein:
    the substrate includes:
       the bonding pad formed of a thin foil,
       the first signal trace, coupled to the bonding pad, plated,
       the second signal trace on the substrate adjacent to the first signal trace, and
       the pedestal on the second signal trace having a staggered position from the bonding pad;
    the integrated circuit mounted on the substrate includes the integrated circuit having a fine pitch array of the contact pad; and
    the electrical interconnect coupled between the integrated circuit, the bonding pad, the pedestal, or a combination thereof.

15. The system as claimed in claim 14 wherein the pedestal includes:
    a ball bond on the second signal trace includes the ball bond positioned in a staggered array; and
    the ball bond coined for creating a flat surface.

16. The system as claimed in claim 14 further comprising a staggered second row of the bonding pad for connecting the integrated circuit includes the staggered second row positioned in the gaps of the first row.

17. The system as claimed in claim 14 wherein the substrate includes:
    the first signal trace on the substrate;
    the second signal trace adjacent to the first signal trace;
    the pedestal on the second signal trace; and
    the bonding pad, coupled to the first signal trace, positioned in line with the pedestal includes an electrical interconnect having a vertical clearance form the bonding pad.

18. The system as claimed in claim 14 further comprising an integrated circuit package formed by the substrate, the integrated circuit, and the electrical interconnect encapsulated includes a printed circuit board assembled with the integrated circuit package.

* * * * *